(12) United States Patent
Kobayashi (10) Patent No.: US 9,525,059 B1
(45) Date of Patent: Dec. 20, 2016

(54) SEMICONDUCTOR DEVICE WITH GRADED DRIFT REGION

(71) Applicant: KABUSHIKI KAISHA TOSHIBA, Tokyo (JP)

(72) Inventor: Kenya Kobayashi, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/059,271

(22) Filed: Mar. 2, 2016

(30) Foreign Application Priority Data

Sep. 11, 2015 (JP) .................................. 2015-179161

(51) Int. Cl.
| | |
|---|---|
| H01L 27/148 | (2006.01) |
| H01L 29/78 | (2006.01) |
| H01L 29/40 | (2006.01) |
| H01L 29/08 | (2006.01) |
| H01L 29/10 | (2006.01) |

(52) U.S. Cl.
CPC ....... *H01L 29/7813* (2013.01); *H01L 29/0865* (2013.01); *H01L 29/0882* (2013.01); *H01L 29/1045* (2013.01); *H01L 29/1095* (2013.01); *H01L 29/404* (2013.01); *H01L 29/7811* (2013.01)

(58) Field of Classification Search
CPC .................. H01L 2924/00014; H01L 2924/00; H01L 29/1608; H01L 29/1095; H01L 2224/48247; H01L 29/66068; H01L 29/7813; H01L 2924/00012; H01L 29/0696; H01L 29/7802; H01L 29/0619; H01L 2924/181

See application file for complete search history.

(56) References Cited

U.S. PATENT DOCUMENTS

| | | | |
|---|---|---|---|
| 5,637,898 | A | 6/1997 | Baliga |
| 5,998,833 | A | 12/1999 | Baliga |
| 6,787,847 | B2 | 9/2004 | Disney |
| 8,502,305 | B2 | 8/2013 | Ohta et al. |
| 8,723,253 | B2 | 5/2014 | Ohta et al. |
| 2014/0284773 | A1 | 9/2014 | Nishiguchi |
| 2014/0287574 | A1 | 9/2014 | Takahashi et al. |

OTHER PUBLICATIONS

Kenya Kobayashi et al. "100 V Class Multiple Stepped Oxide Field Plate Trench MOSFET (MSO-FP-MOSFET) Aimed to Ultimate Structure Realization", Proceedings of the 27th Int. Symposium on Power Semiconductor Devices & IC's. May 10-14, 2015. 4 pages.

*Primary Examiner* — Robert Bachner
(74) *Attorney, Agent, or Firm* — Patterson & Sheridan, LLP (57) ABSTRACT

A semiconductor device includes a semiconductor layer that has a first surface and a second surface, a drift region of a first conductivity type in the semiconductor layer, a body region of a second conductivity type between the drift region and the first surface, a source region of first conductivity type, a first gate electrode, a second gate electrode with the body region interposed between the first gate electrode and the second gate electrode, first and second gate insulating films, a first field plate electrode between the second surface and the first gate electrode, a second field plate electrode between the second surface and the second gate electrode, a first region of the first conductivity type in the drift region, a second region between the first region and the body region, and a third region between the second region and the body region.

20 Claims, 9 Drawing Sheets

SEMICONDUCTOR DEVICE WITH GRADED DRIFT REGION

CROSS-REFERENCE TO RELATED APPLICATION

This application is based upon and claims the benefit of priority from Japanese Patent Application No. 2015-179161, filed on Sep. 11, 2015, the entire contents of which are incorporated herein by reference.

FIELD

Embodiments described herein relate generally to a semiconductor device.

BACKGROUND

For improved miniaturization or higher performance of a transistor, a vertical transistor having a gate electrode buried in a trench is often used. In the vertical transistor, drain-source breakdown voltage (hereinafter, also referred to as "breakdown voltage") and ON resistance are in a trade-off relationship. That is, if impurity concentration of a drift layer increases to decrease the ON resistance, the breakdown voltage decreases. Conversely, if the impurity concentration of the drift layer is decreased to increase the breakdown voltage, the ON resistance increases.

There is a structure in which a field plate electrode is provided below a gate electrode in a trench, which is used as a method of improving the trade-off relationship between breakdown voltage and ON resistance. An electric field distribution of a drift layer is changed by the presence of a field plate electrode, whereby a breakdown voltage of a vertical transistor can be increased while an impurity concentration of a drift layer is maintained. However, further improvement of the trade-off relationship between the breakdown voltage and the ON resistance of the vertical transistor is required.

DETAILED DESCRIPTION

An example embodiment provides a vertical transistor-type semiconductor device having a high breakdown voltage and a low ON resistance.

In general, according to one embodiment, a semiconductor device includes: a semiconductor layer that has a first surface and a second surface, a drift region of a first conductivity type in the semiconductor layer, a body region of a second conductivity type in the semiconductor layer between the drift region and the first surface, a source region of first conductivity type in the semiconductor layer between the body region and the first surface, a first gate electrode, a second gate electrode, the body region being interposed between the first gate electrode and the second gate electrode, a first gate insulating film between the first gate electrode and the body region, a second gate insulating film between the second gate electrode and the body region, a first field plate electrode between the second surface and the first gate electrode, a second field plate electrode between the second surface and the second gate electrode, a first field plate insulating film between the first field plate electrode and the drift region, a second field plate insulating film between the second field plate electrode and the drift region, a first region of the drift region having at least a portion between the first field plate electrode and the second field plate electrode, a second region of the drift region between the first region and the body region having an impurity concentration of the first conductivity type that is higher than an impurity concentration of the first conductivity type in the first region, and a third region of the drift region between the second region and the body region having an impurity concentration of the first conductivity type that is lower than an impurity concentration of the first conductivity type in the second region.

Hereinafter, embodiments of the invention will be described with reference to the accompanying drawings. In the following description, the same symbols or reference numerals will be attached to the same or similar members or the like, and description with regard to the members or the like described once will be omitted.

In addition, in the following description, notation $n^+$, $n$, $n^-$, $p^+$, and p indicate a relative level of impurity concentration of each conductivity type. That is, $n^+$ indicates that n-type impurity concentration of $n^+$ is relatively higher than that of n, and $n^-$ indicates that n-type impurity concentration of $n^-$ is relatively lower than that of n. In addition, $p^+$ indicates that p-type impurity concentration of $p^+$ is relatively higher than that of p. In some cases an $n^+$-type and an $n^-$-type material are simply described as an n-type material, and likewise a $p^+$-type is may be described simply as a p-type.

An impurity concentration can be measured by, for example, secondary ion mass spectrometry (SIMS). In addition, a relative level of impurity concentration can also be determined from a level of carrier concentration which is calculated by, for example, scanning capacitance microscopy (SCM). In addition, a position of a depth direction of an impurity region can be obtained from a combined image of an SCM image and an atomic force microscopy (AFM) image.

First Embodiment

A semiconductor device according to the first embodiment includes a semiconductor layer having a first surface and a second surface, a drift region of a first conductivity type that is provided in the semiconductor layer, a body region of a second conductivity type that is provided in the semiconductor layer between the drift region and the first surface, a source region of the first conductivity type that is provided in the semiconductor layer between the body region and the first surface, a first gate electrode, a second gate electrode in which the body region is provided between the first gate electrode and the second gate electrode, a first gate insulating film that is provided between the first gate electrode and the body region, a second gate insulating film that is provided between the second gate electrode and the body region, a first field plate electrode that is provided between the second surface and the first gate electrode, a second field plate electrode that is provided between the second surface and the second gate electrode, a first field plate insulating film that is provided between the first field plate electrode and the drift region, a second field plate insulating film that is provided between the second field plate electrode and the drift region, a first region of the first conductivity type that is provided inside the drift region between the first field plate electrode and the second field plate electrode, a second region that is provided in the drift region between the first region and the body region and has an impurity concentration of the first conductivity type higher than that of the first region, and a third region that is provided in the drift region between the second region and the body region and has an impurity concentration of the first conductivity type lower than that of the second region.

Figure 1:
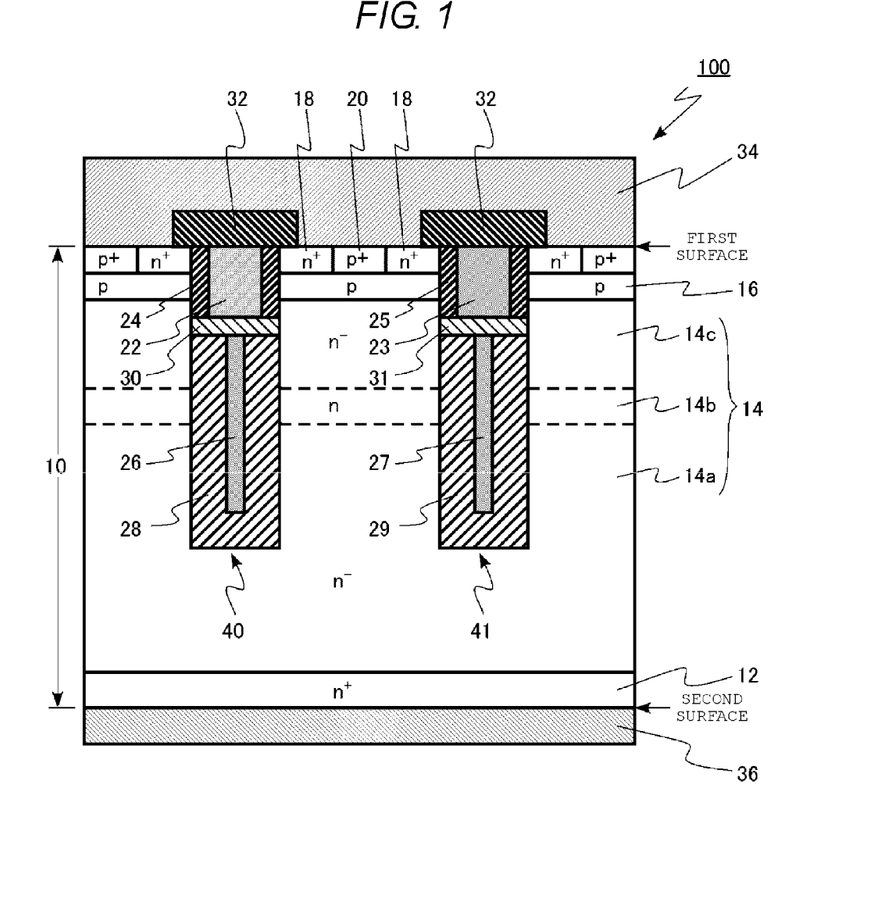
FIG. 1 is a schematic sectional view of a semiconductor device according to a first embodiment.

FIG. 1 is a schematic sectional view of a semiconductor device according to a first embodiment. The semiconductor device 100 according to the first embodiment is a vertical metal oxide semiconductor field effect transistor (MOSFET) which includes a gate electrode inside a trench. Hereinafter, an example in which a first conductivity type is an n-type and a second conductivity type is a p-type is described. Particularly an n channel type MOSFET will be described as an example.

The MOSFET 100 includes a silicon layer (semiconductor layer) 10. The silicon layer 10 includes an $n^+$-type drain region 12, an $n^-$-type or an n-type drift region 14, a p-type body region 16, an $n^+$-type source region 18, and a $p^+$-type body contact region 20. The $n^-$-type or an n-type drift region 14 includes an $n^-$-type lower portion region (first region) 14a, an n-type intermediate region (second region) 14b, and an $n^-$-type upper portion region (third region) 14c.

In addition, the MOSFET 100 includes a first gate electrode 22, a second gate electrode 23, a first gate insulating film 24, a second gate insulating film 25, a first field plate electrode 26, a second field plate electrode 27, a first field plate insulating film 28, a second field plate insulating film 29, a first insulating film 30, a second insulating film. 31, an interlayer insulating film. 32, a source electrode 34, and a drain electrode 36. In addition, the MOSFET 100 includes a first trench 40 and a second trench 41.

The silicon layer 10 includes a first surface and a second surface. Hereinafter, the first surface is referred to as a front surface, and the second surface is referred to as a rear surface.

The silicon layer 10 may be silicon (Si) of a single crystal. A surface of the silicon layer 10 is tilted by degrees greater than or equal to zero degree and less than or equal to eight degrees, with respect to the (100) plane, for example.

The $n^+$-type drain region 12 is provided inside the silicon layer 10. The $n^+$-type drain region 12 contains n-type impurity. The n-type impurity is, for example, phosphorus (P) or arsenic (As). For example, impurity concentration of an n-type is greater than or equal to $1\times10^{18}$ cm$^{-3}$ and less than or equal to $1\times10^{21}$ cm$^{-3}$.

The drift region 14 of an $n^-$-type or an n-type is provided inside the silicon layer 10. The drift region 14 is provided on the drain region 12. The drift region 14 contains n-type impurity. The n-type impurity is, for example, phosphorus (P) or arsenic (As). For example, impurity concentration of an n-type is greater than or equal to $1\times10^{14}$ cm$^{-3}$ and less than or equal to $1\times10^{17}$ cm$^{-3}$. The drift region 14 is, for example, an epitaxial growth layer which is formed on the $n^+$-type drain region 12 by epitaxial growth.

The drift region 14 includes the $n^-$-type lower portion region 14a, the n-type intermediate region 14b, and the $n^-$-type upper portion region 14c. At least a portion of the $n^-$-type lower portion region 14a is provided between the first field plate electrode 26 and the second field plate electrode 27.

The intermediate region 14b is provided between the lower portion region 14a and the p-type body region 16. The n-type impurity concentration of the intermediate region 14b is greater than n-type impurity concentration of the lower portion region 14a. The intermediate region 14b has the peak of impurity distribution of n-type impurity.

The intermediate region 14b is formed by performing, for example, ion injection of n-type impurity onto the drift region 14. For example, the intermediate region 14b can also be formed at the same time when the drift region 14 is formed by epitaxial growth.

The upper portion region 14c is provided between the intermediate region 14b and the body region 16. The intermediate region 14b is interposed between the lower portion region 14a and the upper portion region 14c. The n-type impurity concentration of the upper portion region 14c is lower than that of the intermediate region 14b.

The n-type impurity concentration of the intermediate region 14b is, for example, higher than or equal to 1.5 times and lower than or equal to 10 times the n-type impurity concentration of the lower portion region 14a. The n-type impurity concentration of the intermediate region 14b is, for example, higher than or equal to 1.5 times and lower than or equal to 10 times the n-type impurity concentration of the upper portion region 14c.

The n-type impurity concentration of the intermediate region 14b which becomes a comparative target is a maximum of n-type impurity concentration in the semiconductor layer 10, that is, the peak value of the concentration distribution of the n-type impurity. In addition, the n-type impurity concentrations of the lower portion region 14a and the upper portion region 14c is at the tail of the concentration distribution leading from the peak of the n-type impurity concentration of the intermediate region 14b.

For example, n-type impurity concentration of the lower portion region 14a is substantially the same as that of the upper portion region 14c.

The intermediate region 14b is provided between the first field plate electrode 26 and the second field plate electrode 27.

In addition, for example, a position in which n-type impurity concentration of the intermediate region 14b is the maximum is placed between two surfaces which are obtained by equally dividing the drift region 14 between a surface parallel with a rear surface of the silicon layer 10 including an end portion on a rear surface side of the first field plate electrode 26, and a surface parallel with a rear surface of the silicon layer 10 including a boundary between the drift region 14 and the body region 16, into three regions.

The p type body region 16 is provided inside the silicon layer 10 between the drift region 14 and a front surface of the silicon layer 10. When the MOSFET 100 is turned on, a channel is formed in a region that comes into contact with the first gate insulating film 24 and the second gate insulating film 25.

The body region 16 contains p type impurity. The p type impurity is, for example, boron (B). For example, the p type impurity concentration is greater than or equal to $1\times10^{16}$ cm$^{-3}$ and less than or equal to $1\times10^{18}$ cm$^{-3}$.

The n+-type source region 18 is provided inside the silicon layer 10 between the body region 16 and a front surface (first surface) of the silicon layer 10. The source region 18 contains n-type impurity. The n-type impurity is, for example, phosphorus (P) or arsenic (As). For example, the n-type impurity concentration is greater than or equal to $1 \times 10^{19}$ cm$^{-3}$ and less than or equal to $1 \times 10^{21}$ cm$^{-3}$.

The p+-type body contact region 20 is provided inside the silicon layer 10 between the body region 16 and the first surface. The body contact region 20 is interposed between two source regions 18.

The body contact region 20 contains p type impurity. For example, the p type impurity is boron (B). For example, the p type impurity concentration is greater than or equal to $1 \times 10^{19}$ cm$^{-3}$ and less than or equal to $1 \times 10^{21}$ cm$^{-3}$.

The first gate electrode 22 is provided inside the first trench 40. For example, the first gate electrode 22 is formed of polycrystalline silicon containing n-type impurity or p type impurity.

The second gate electrode 23 is provided inside the second trench 41. The body region 16 is interposed between the second gate electrode 23 and the first gate electrode 22.

The first gate insulating film 24 is provided between the first gate electrode 22 and the body region 16. The first gate insulating film 24 is, for example, a silicon oxide film.

The second gate insulating film 25 is provided between the second gate electrode 23 and the body region 16. The second gate insulating film 25 is, for example, a silicon oxide film.

The first field plate electrode 26 is provided inside the first trench 40. The first field plate electrode 26 is provided between the first gate electrode 22 and a rear surface (second surface) of the silicon layer 10.

The first field plate electrode 26 has a function of changing electric field distribution of the drift region 14 and increasing breakdown voltage of the MOSFET 100, when the MOSFET 100 is turned off. For example, the first field plate electrode 26 is formed of polycrystalline silicon containing n-type impurity or p-type impurity.

The second field plate electrode 27 is provided inside the second trench 41. The second field plate electrode 27 is provided between the second gate electrode 23 and the second surface.

The second field plate electrode 27 has a function of changing electric field distribution of the drift region 14 and increasing breakdown voltage of the MOSFET 100, when the MOSFET 100 is turned off. For example, the second field plate electrode 27 is formed of polycrystalline silicon containing n-type impurity or p type impurity.

The first field plate insulating film 28 is provided between the first field plate electrode 26 and the drift region 14. The first field plate insulating film 28 is, for example, a silicon oxide film.

The second field plate insulating film 29 is provided between the second field plate electrode 27 and the drift region 14. The second field plate insulating film 29 is, for example, a silicon oxide film.

The first insulating film 30 is provided between the first gate electrode 22 and the first field plate electrode 26. The first insulating film 30 has a function of electrically decoupling the first gate electrode 22 from the first field plate electrode 26. The first field plate electrode 26 is fixed to, for example, a ground potential. The first insulating film 30 is, for example, a silicon oxide film.

The second insulating film 31 is provided between the second gate electrode 23 and the second field plate electrode 27. The second insulating film 31 has a function of electrically decoupling the second gate electrode 23 from the second field plate electrode 27. The second field plate electrode 27 is fixed to, for example, a ground potential. The second insulating film 31 is, for example, a silicon oxide film.

The interlayer insulating film 32 is provided between the first gate electrode 22 and the source electrode 34. In addition, the interlayer insulating film 32 is provided between the second gate electrode 23 and the source electrode 34. The interlayer insulating film 32 has a function of electrically decoupling the first gate electrode 22 and the source electrode 34 from the second gate electrode 23 and the source electrode 34. The interlayer insulating film 32 is, for example, a silicon oxide film.

The source electrode 34 is provided on the first surface. The source electrode 34 is electrically coupled to the source region 18 and the body contact region 20. The source electrode 34 is in contact with the source region 18 and the body contact region 20. The source electrode 34 is a metal electrode. The source electrode 34 is, for example, a stacked film of titanium (Ti) and aluminum (Al).

The drain electrode 36 is provided on the second surface. The drain electrode 36 is electrically coupled to the drift region 14 and the drain region 12. The drain electrode 36 is in contact with the drain region 12. The drain region 12 is between the drift region 14 and the drain electrode 36. The drain electrode 36 is a metal electrode. The drain electrode 36 is a stacked film of titanium (Ti), aluminum (Al), nickel (Ni), copper (Cu), silver (Ag), gold (Au) or the like.

Hereinafter, operations and effects of the semiconductor device according to the present embodiment will be described. FIGS. 2A and 2B, FIG. 3, FIGS. 4A and 4B, and FIGS. 5A and 5B are explanatory diagrams illustrating operations and effects of the semiconductor device according to the present embodiment.

Figure 2A:
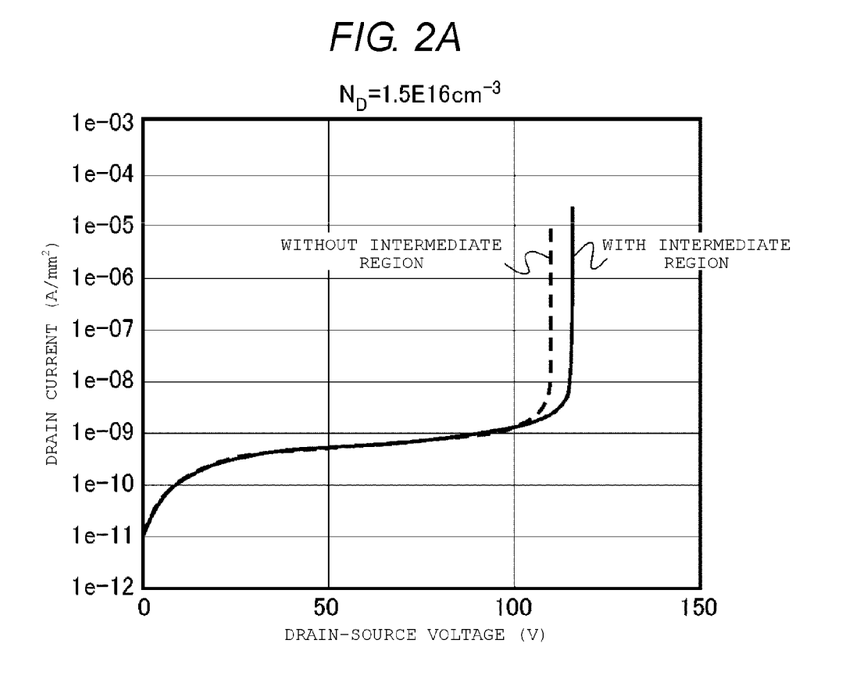
FIGS. 2A and 2B are explanatory diagrams illustrating operation and effect of the semiconductor device according to the first embodiment.
Figure 2B:
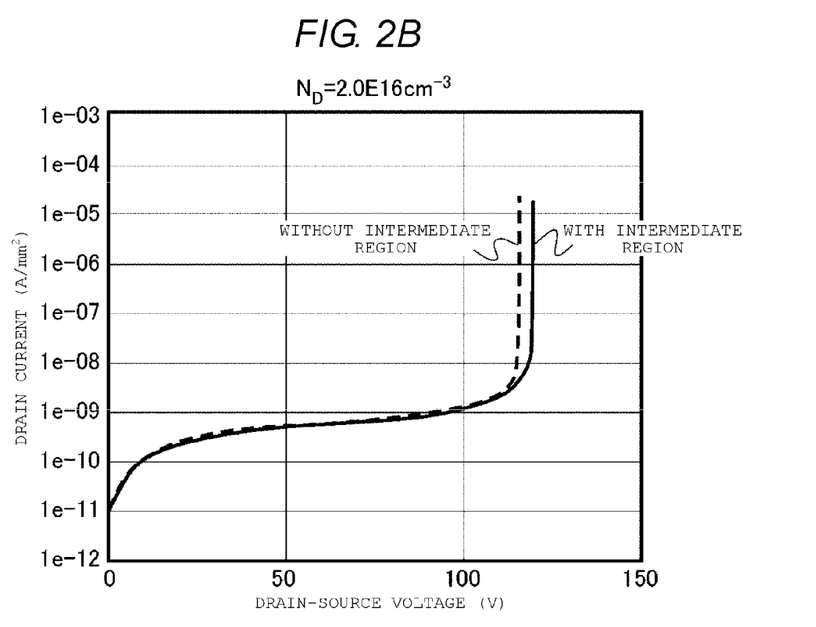

FIGS. 2A and 2B illustrate simulation results of current-voltage characteristics of the MOSFET. FIGS. 2A and 2B illustrate the current-voltage characteristics of the MOSFET of a case in which ion injection of phosphorus (P) is performed onto the n−-type drift region 14 by using acceleration energy of 4.0 MeV, whereby the intermediate region 14b is formed. FIG. 2A illustrates a case in which n-type impurity concentration of the n−-type drift region 14 is $1.5 \times 10^{16}$ cm$^{-3}$ before ion injection is performed, and FIG. 2B illustrates a case in which n-type impurity concentration of the n−-type drift region 14 is $2.0 \times 10^{16}$ cm$^{-3}$.

By providing the intermediate region 14b, it is clear that breakdown voltage between a drain and a source increases approximately 5 V as illustrated in FIG. 2A, and the drain-source breakdown voltage increases approximately 4 V as illustrated in FIG. 2B, as compared to a case in which the intermediate region 14b is not provided.

Figure 3:
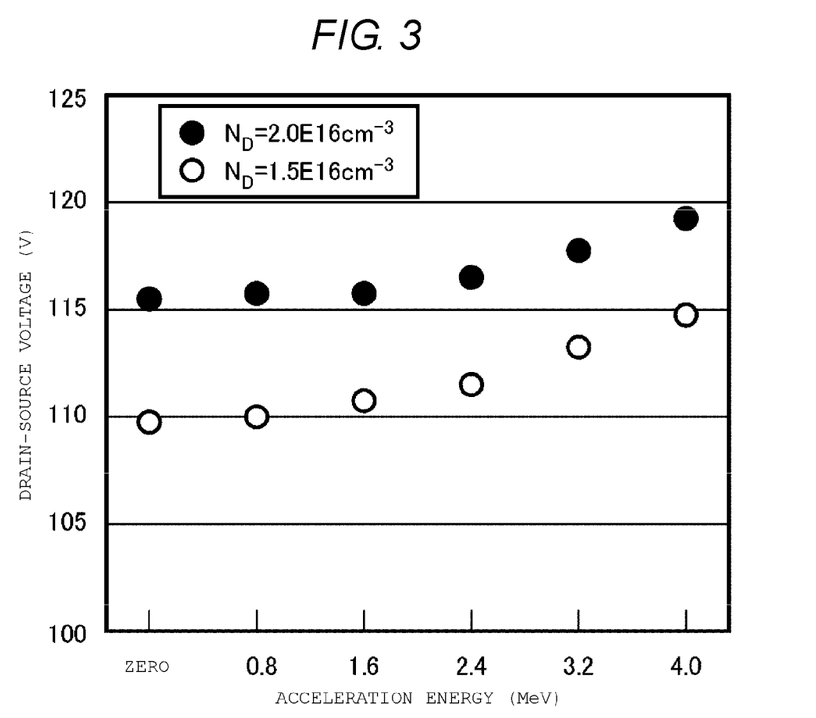
FIG. 3 is an explanatory diagram illustrating operation and effect of the semiconductor device according to the first embodiment.

FIG. 3 illustrates a simulation result of acceleration energy dependence on drain-source breakdown voltage. FIG. 3 illustrates results of a case in which n-type impurity concentration of the n−-type drift region 14 is $1.5 \times 10^{16}$ cm$^{-3}$ before ion injection is performed and a case in which n-type impurity concentration of the n−-type drift region 14 is $2.0 \times 10^{16}$ cm$^{-3}$. Acceleration energy is changed in a range of 0.8 MeV to 4.0 MeV.

Regardless of the concentration of the drift region 14, drain-source breakdown voltage increases in accordance with an increase of the acceleration energy. That is, as the depth from a front surface of the silicon layer 10 of the intermediate region 14b increases, drain-source breakdown voltage is increased. Particularly, if the acceleration energy is 3.2 MeV or more, the drain-source breakdown voltage is remarkably increased, as compared to a case in which the intermediate region 14b is not provided.

Figure 4A:
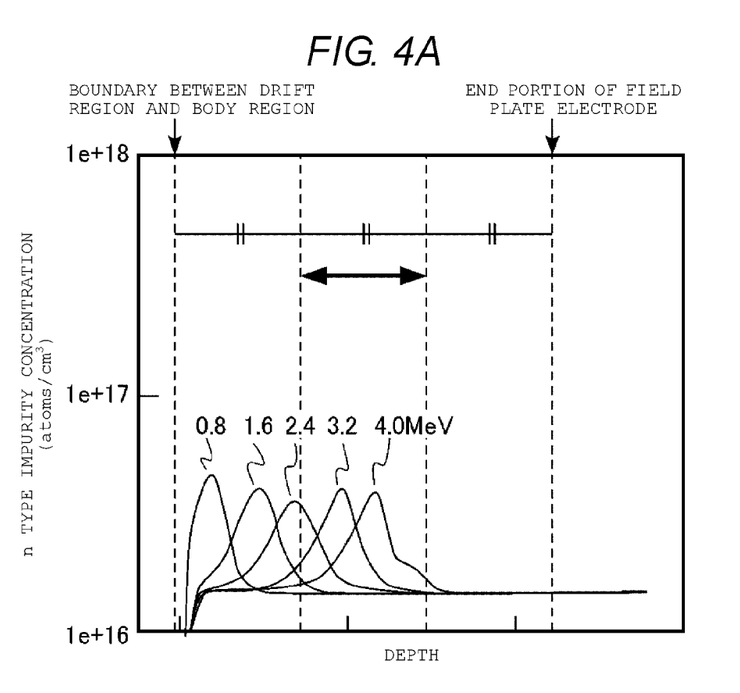
FIGS. 4A and 4B are explanatory diagrams illustrating operation and effect of the semiconductor device according to the first embodiment.
Figure 4B:
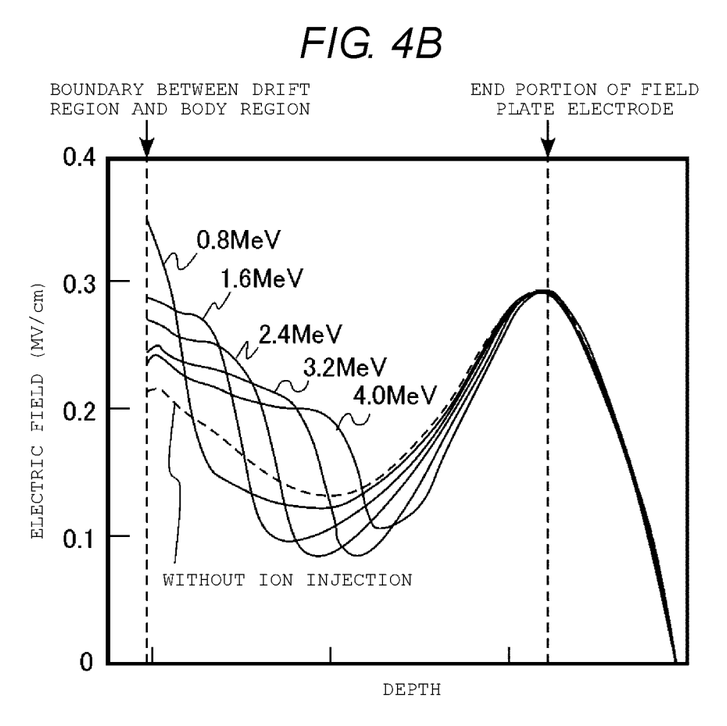

FIGS. 4A and 4B illustrate simulation results of acceleration energy dependence of distribution of n-type impurity concentration in a depth direction and electric field distribution in a depth direction. FIG. 4A illustrates distribution of n-type impurity concentration, and FIG. 4B illustrates electric field distribution. FIGS. 4A and 4B illustrate a case in which n-type impurity concentration of the drift region 14 of an n⁻-type is $1.5 \times 10^{16}$ cm$^{-3}$, before ion injection is performed.

As illustrated in FIG. 4A, as acceleration energy increases, a position in which n-type impurity concentration of the intermediate region 14b is the maximum becomes deeper. A maximum value of the n-type impurity concentration of the intermediate region 14b is in a range from concentration higher than or equal to $3 \times 10^{16}$ cm$^{-3}$ to concentration lower than or equal to $5 \times 10^{16}$ cm$^{-3}$. The maximum value is in a range from two times to four times the n-type impurity concentrations of the lower portion region 14a and the upper portion region 14c.

It is preferable that a position in which the n-type impurity concentration of the intermediate region 14b is at a maximum at a position between two (conceptual) surfaces which are obtained by equally dividing the drift region 14 between a surface parallel with a rear surface of the silicon layer 10 including an end portion on a rear surface side of the first field plate electrode 26, and a surface parallel with a rear surface of the silicon layer 10 including a boundary between the drift region 14 and the p type body region 16, into three equal regions. That is, it is preferable that the position in which n-type impurity concentration of the intermediate region 14b is a maximum is placed in a range denoted by a double-headed arrow in FIG. 4A.

The position in which the n-type impurity concentration of the intermediate region 14b is the maximum is included in the above-described range, and thus drain-source breakdown voltage is remarkably increased, as compared to a case in which the intermediate region 14b is not provided.

As illustrated in FIG. 4B, if the ion injection is not performed, that is, if the intermediate region 14b is not provided, the electric field strength distribution has the peak at a boundary between the drift region 14 and the p-type body region 16, and both end portions on the bottom side of the trench of the first field plate electrode 26, and an intermediate portion between two peaks exhibits a concave shape.

By performing ion injection and providing the intermediate region 14b, the electric field strength of the intermediate portion exhibiting the concave shape is raised. Thus, as acceleration energy of ion injection increases, raising degrees of the electric field strength of the intermediate portion increases. The drain-source breakdown voltage is an integral value of the electric field strength in a depth direction. In the present embodiment, by providing the intermediate region 14b, the electric field strength is raised, an integral value of the electric field strength in a depth direction is increased, and the drain-source breakdown voltage is increased.

Figure 5A:
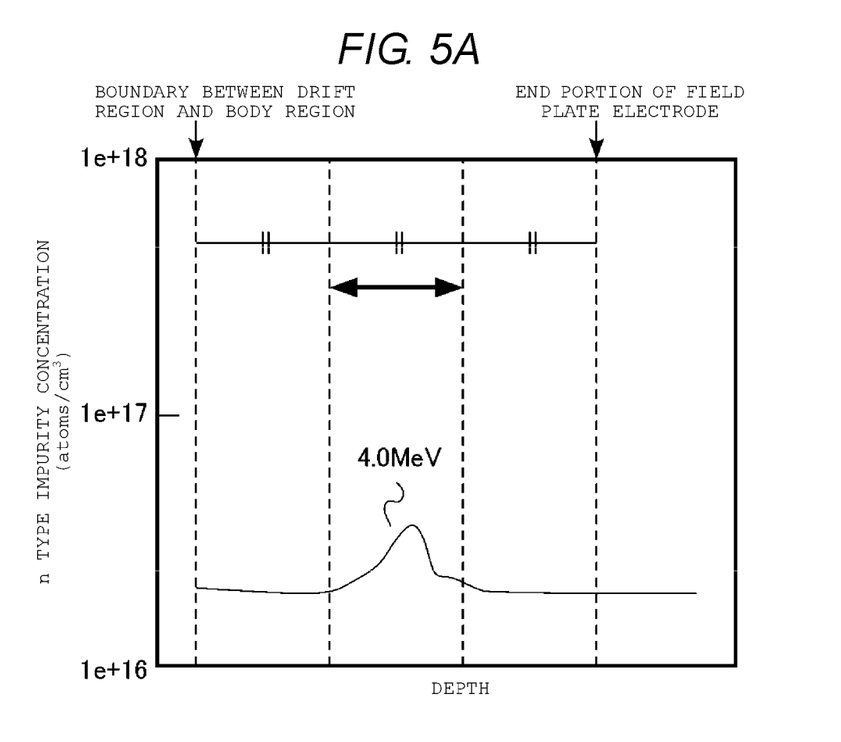
FIGS. 5A and 5B are explanatory diagrams illustrating operation and effect of the semiconductor device according to the first embodiment.
Figure 5B:
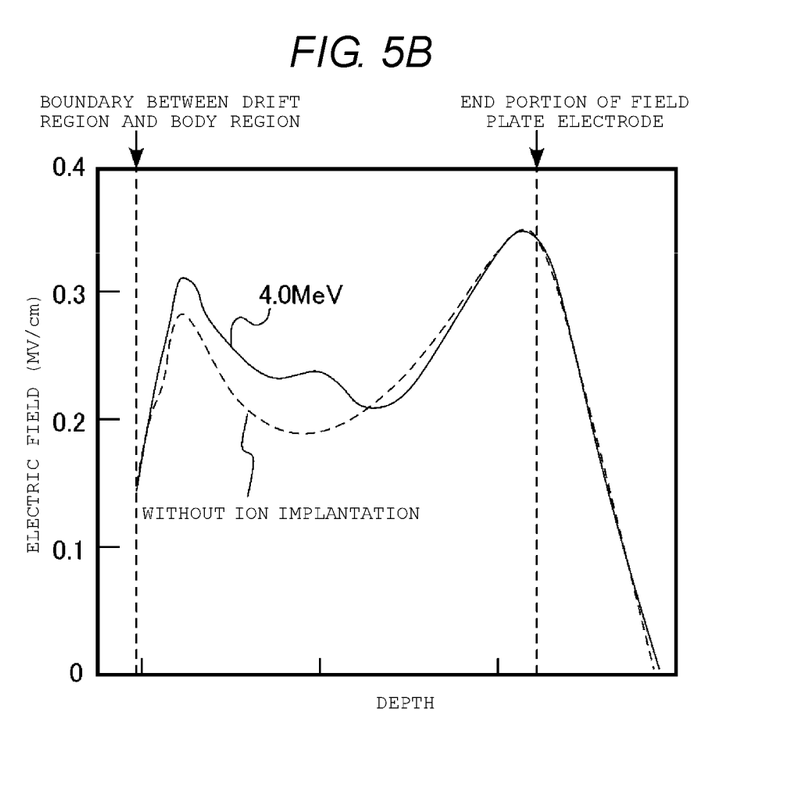

FIGS. 5A and 5B illustrate simulation results of distribution of n-type impurity concentration and electric field distribution in a depth direction. FIGS. 5A and 5B illustrate only a case in which the acceleration energy is 4.0 MeV. FIG. 5A illustrates the distribution of the n-type impurity concentration, and FIG. 5B illustrates the electric field distribution. FIGS. 5A and 5B illustrate a case in which the n-type impurity concentration of the drift region 14 of an n⁻-type is $2 \times 10^{16}$ cm$^{-3}$, before the ion injection is performed.

As illustrated in FIG. 5A, a maximum value of the n-type impurity concentration of the intermediate region 14b is in a range from concentration higher than or equal to $3 \times 10^{16}$ cm$^{-3}$ to concentration lower than or equal to $4 \times 10^{16}$ cm$^{-3}$. The maximum value is in a range of from 1.5 times to two times the n-type impurity concentrations of the lower portion region 14a and the upper portion region 14c.

As illustrated in FIG. 5B, in the same manner as in a case of FIG. 4B, by providing the intermediate region 14b, the electric field strength is raised in the vicinity of an intermediate portion between a boundary between the drift region 14 and the p-type body region 16, and an end portion on a rear surface side of the first field plate electrode 26. For this reason, drain-source breakdown voltage is increased.

In the MOSFET 100, the intermediate region 14b having an n-type impurity concentration higher than those of the lower portion region 14a and the upper portion region 14c are placed between the lower portion region 14a and the upper portion region 14c. For this reason, resistance of the drift region 14, a so-called mesa region, interposed between the first trench 40 and the second trench 41, is decreased, as compared to a case in which the intermediate region 14b is not provided. Thus, the drain-source breakdown voltage increases, and ON resistance is reduced.

It is preferable that n-type impurity concentration of the intermediate region 14b is higher than or equal to 1.5 times and lower than or equal to 10 times the n-type impurity concentration of the n⁻-type lower portion region 14a. In addition, it is preferable that the n-type impurity concentration of the intermediate region 14b is higher than or equal to 1.5 times as large as and lower than or equal to 10 times as large as the n-type impurity concentration of the upper portion region 14c. If the n-type impurity concentration of the intermediate region 14b is below the range, there is a possibility that a sufficient breakdown voltage increasing effect is not obtained. In addition, if the n-type impurity concentration of the intermediate region 14b is above the range, a slope of electric potential distribution becomes steep, and thus electric field strength becomes too strong, and in contrary to this, there is a possibility that breakdown voltage is degraded.

As described above, the MOSFET 100 according to the present embodiment can realize an increase of the drain-source breakdown voltage and a decrease of the ON resistance at the same time. Thus, according to the MOSFET 100, it is possible to improve trade-off relationship between breakdown voltage of a vertical transistor and ON resistance.

Second Embodiment

Figure 6:
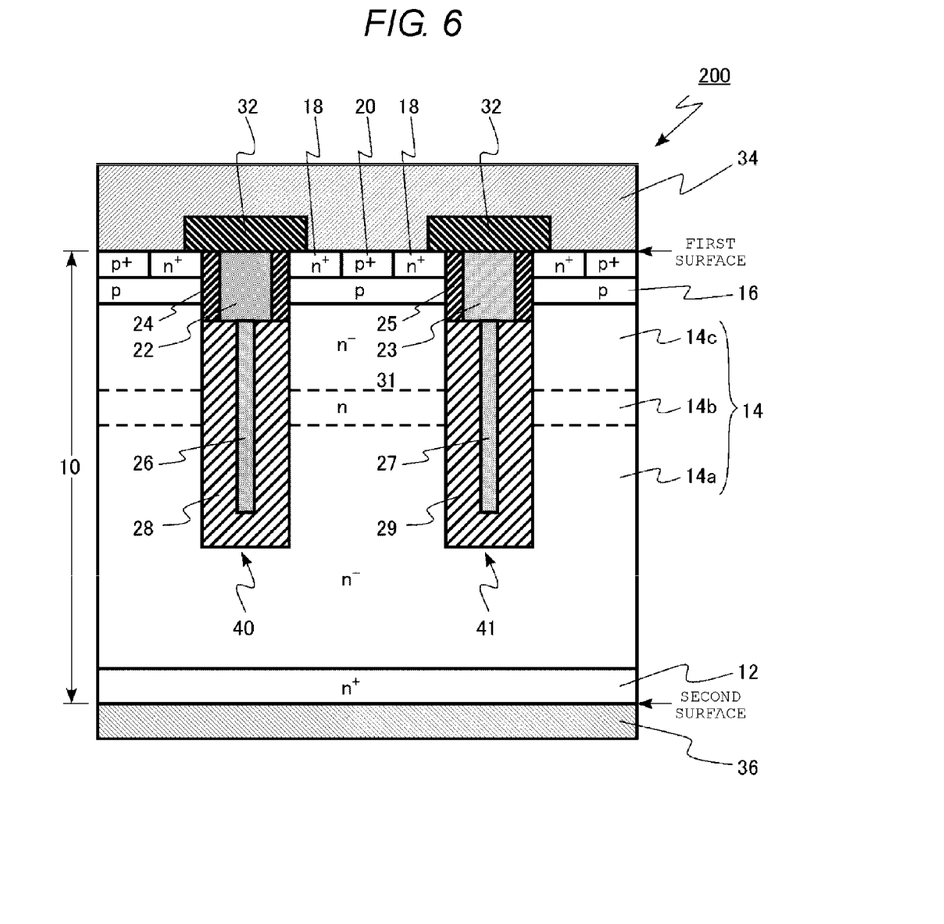
FIG. 6 is a schematic sectional view of a semiconductor device according to a second embodiment.

A semiconductor device according to the present embodiment is the same as the semiconductor device according to the first embodiment except that the semiconductor device according to the present embodiment does not include the first insulating film and the second insulating film. Thus, description with regard to content which overlaps that of the first embodiment will be omitted.

FIG. 6 is a schematic sectional view of a semiconductor device according to the present embodiment. The semiconductor device 200 according to the present embodiment is a vertical MOSFET including a gate electrode inside a trench.

The semiconductor device 200 according to the present embodiment includes a silicon layer (semiconductor layer)

10. The silicon layer 10 includes an n⁺-type drain region 12, an n⁻-type or n-type drift region 14, a p-type body region 16, an n⁺-type source region 18, and a p⁺-type body contact region 20. The drift region 14 includes an n⁻-type lower portion region (first region) 14a, an n-type intermediate region (second region) 14b, and an n⁻-type upper portion region (third region) 14c.

In addition, the MOSFET 200 includes a first gate electrode 22, a second gate electrode 23, a first gate insulating film 24, a second gate insulating film 25, a first field plate electrode 26, a second field plate electrode 27, a first field plate insulating film 28, a second field plate insulating film 29, an interlayer insulating film 32, a source electrode 34, and a drain electrode 36. In addition, the MOSFET 200 includes a first trench 40 and a second trench 41.

In the MOSFET 200, the first gate electrode 22 and the first field plate electrode 26 are electrically and physically coupled to each other. In addition, the second gate electrode 23 and the second field plate electrode 27 are electrically and physically coupled to each other.

Thus, a gate voltage is applied to the first field plate electrode 26 and the second field plate electrode 27.

The MOSFET 200 according to the present embodiment can improve trade-off relationship between breakdown voltage and ON resistance of a vertical transistor by the same operation as in the first embodiment.

As described above, in the first and second embodiments, a case in which the first conductivity type is an n type and a second conductivity type is a p type is used as an example, but it is also possible to use a configuration in which the first conductivity type is a p type and a second conductivity type is an n type.

In addition, in the first and second embodiments, an example in which silicon is used as a semiconductor material is described, but it is also possible to use another semiconductor material, such as, silicon carbide (SiC), gallium nitride, or the like.

In addition, in the first and second embodiments, a case in which thicknesses of the first field plate insulating film 28 and the second field plate insulating film 29 are constant is described as an example, but it is possible to use a configuration in which the drain-source breakdown voltage is further increased by forming the thicknesses of the first field plate insulating film. 28 and the second field plate insulating film 29 in a multiple stages, or by continuously changing the thickness in a depth direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor layer that has a first surface and a second surface;
    a drift region of a first conductivity type in the semiconductor layer;
    a body region of a second conductivity type in the semiconductor layer between the drift region and the first surface;
    a source region of the first conductivity type in the semiconductor layer between the body region and the first surface;
    a first gate electrode;
    a second gate electrode, the body region being between the first gate electrode and the second gate electrode;
    a first gate insulating film between the first gate electrode and the body region;
    a second gate insulating film between the second gate electrode and the body region;
    a first field plate electrode between the second surface and the first gate electrode;
    a second field plate electrode between the second surface and the second gate electrode;
    a first field plate insulating film between the first field plate electrode and the drift region;
    a second field plate insulating film between the second field plate electrode and the drift region;
    a first region of the drift region having at least a portion between the first field plate electrode and the second field plate electrode;
    a second region of the drift region between the first region and the body region, having an impurity concentration of the first conductivity type that is higher than an impurity concentration of the first conductivity type in the first region; and
    a third region of the drift region between the second region and the body region, having an impurity concentration of the first conductivity type that is lower than the impurity concentration of the first conductivity type in the second region.

2. The semiconductor device according to claim 1, wherein the impurity concentration of the first conductivity type in the second region is higher than or equal to 1.5 times the impurity concentration of the first conductivity type in the first region.

3. The semiconductor device according to claim 1, wherein the second region is between the first field plate and the second field plate.

4. The semiconductor device according to claim 1, wherein a position at which the impurity concentration of the first conductivity type in the second region is at a maximum that is between two surfaces which are obtained by equally dividing a region between a surface parallel with the second surface and including an end portion on the second surface side of the first field plate, and a surface parallel with the second surface and including a boundary between the drift region and body region, into three regions.

5. The semiconductor device according to claim 1, further comprising:
    a first insulating film between the first gate electrode and the first field plate electrode; and
    a second insulating film between the second gate electrode and the second field plate electrode.

6. The semiconductor device according to claim 1, wherein the impurity concentration of the first conductivity type in the first region is substantially the same as the impurity concentration of the first conductivity type in the third region.

7. The semiconductor device according to claim 1, further comprising:
    a source electrode on the first surface and is electrically coupled to the source region; and
    a drain electrode on the second surface and is electrically coupled to the drift region.

8. The semiconductor device according to claim 1, wherein the semiconductor layer is silicon.

9. The semiconductor device according to claim 7, further comprising a drain region of the first conductivity type between the drift region and the drain electrode.

10. A semiconductor device, comprising:
- a semiconductor layer having a first surface and a second surface;
- a drift region of a first conductivity type in the semiconductor layer;
- a body region of a second conductivity type in the semiconductor layer between the drift region and the first surface;
- a source region of the first conductivity type in the semiconductor layer between the body region and the first surface;
- a first gate electrode;
- a second gate electrode, the body region being between the first gate electrode and the second gate electrode;
- a first gate insulating film between the first gate electrode and the body region;
- a second gate insulating film between the second gate electrode and the body region;
- a first field plate electrode between the second surface and the first gate electrode;
- a second field plate electrode between the second surface and the second gate electrode;
- a first field plate insulating film between the first field plate electrode and the drift region;
- a second field plate insulating film between the second field plate electrode and the drift region;
- a first region of the drift region having at least a portion between the first field plate electrode and the second field plate electrode;
- a second region of the drift region between the first region and the body region, and having an impurity concentration of the first conductivity type that is higher than an impurity concentration of the first conductivity type in the first region;
- a third region of the drift region between the second region and the body region, and having an impurity concentration of the first conductivity type that is lower than the impurity concentration of the first conductivity type in the second region;
- a source electrode on the first surface and electrically coupled to the source region;
- a drain electrode on the second surface and electrically coupled to the drift region; and
- a drain region of the first conductivity type between the drift region and the drain electrode.

11. The semiconductor device according to claim 10, wherein the impurity concentration of the first conductivity type in the second region is higher than or equal to 1.5 times the impurity concentration of the first conductivity type in the first region.

12. The semiconductor device according to claim 11, wherein the second region is between the first field plate and the second field plate.

13. The semiconductor device according to claim 10, wherein a position in which the impurity concentration of the first conductivity type of the second region is the maximum is placed between two surfaces which are obtained by equally dividing a region between a surface parallel with the second surface and including an end portion on the second surface side of the first field plate, and a surface parallel with the second surface and including a boundary between the drift region and body region, into three regions.

14. The semiconductor device according to claim 13, further comprising:
- a first insulating film between the first gate electrode and the first field plate electrode; and
- a second insulating film between the second gate electrode and the second field plate electrode.

15. The semiconductor device according to claim 10, wherein the impurity concentration of the first conductivity type in the first region is substantially the same as the impurity concentration of the first conductivity type in the third region.

16. The semiconductor device according to claim 15, wherein the semiconductor layer is single crystal silicon.

17. The semiconductor device according to claim 10, wherein the first gate electrode and the first field plate electrode are in a trench in the semiconductor layer.

18. A semiconductor device, comprising:
- a single crystal semiconductor layer that has a first surface and a second surface;
- a drift region of a first conductivity type in the semiconductor layer;
- a body region of a second conductivity type in the semiconductor layer between the drift region and the first surface;
- a source region of the first conductivity type in the semiconductor layer between the body region and the first surface;
- a first gate electrode;
- a second gate electrode, the body region being between the first gate electrode and the second gate electrode;
- a first gate insulating film between the first gate electrode and the body region;
- a second gate insulating film between the second gate electrode and the body region;
- a first field plate electrode between the second surface and the first gate electrode;
- a second field plate electrode between the second surface and the second gate electrode;
- a first field plate insulating film between the first field plate electrode and the drift region;
- a second field plate insulating film between the second field plate electrode and the drift region;
- a first region in the drift region having at least a portion between the first field plate electrode and the second field plate electrode;
- a second region in the drift region between the first region and the body region, and having an impurity concentration of the first conductivity type that is higher than an impurity concentration of the first conductivity type in the first region;
- a third region in the drift region between the second region and the body region, and having an impurity concentration of the first conductivity type that is lower than the impurity concentration of the first conductivity type in the second region;
- a source electrode on the first surface and electrically coupled to the source region;
- a drain electrode on the second surface and electrically coupled to the drift region; and
- a drain region of the first conductivity type between the drift region and the drain electrode.

19. The semiconductor device according to claim 18, wherein the impurity concentration of the first conductivity type in the second region is higher than or equal to 1.5 times the impurity concentration of the first conductivity type in the first region.

20. The semiconductor device according to claim 18, wherein a position in which the impurity concentration of the first conductivity type of the second region is the maximum is placed between two surfaces which are obtained by equally dividing a region between a surface parallel with the second surface and including an end portion on the second surface side of the first field plate, and a surface parallel with the second surface and including a boundary between the drift region and body region, into three regions.

* * * * *